DIFFERENTIAL ELECTRONIC AMPLIFIER

Filed March 11, 1946

6 Sheets-Sheet 1

Inventor
JOHN E. WILLIAMS

By M. C. Hayes

Attorney

Inventor
JOHN E. WILLIAMS
By M. O. Hayes
Attorney

Dec. 25, 1951 J. E. WILLIAMS 2,579,528

DIFFERENTIAL ELECTRONIC AMPLIFIER

Filed March 11, 1946 6 Sheets-Sheet 3

Inventor

JOHN E. WILLIAMS

By McHayes

Attorney

Inventor
JOHN E. WILLIAMS
By M. O. Hayes
Attorney

Dec. 25, 1951 J. E. WILLIAMS 2,579,528

DIFFERENTIAL ELECTRONIC AMPLIFIER

Filed March 11, 1946 6 Sheets-Sheet 5

Inventor

JOHN E. WILLIAMS

By M. O. Hayes

Attorney

DIFFERENTIAL ELECTRONIC AMPLIFIER

Filed March 11, 1946

Inventor

JOHN E. WILLIAMS

By M. O. Hayes

Attorney

Patented Dec. 25, 1951

2,579,528

UNITED STATES PATENT OFFICE 2,579,528

DIFFERENTIAL ELECTRONIC AMPLIFIER

John E. Williams, United States Navy,
Atlantic City, N. J.

Application March 11, 1946, Serial No. 653,694

14 Claims. (Cl. 179—171)

(Granted under the act of March 3, 1883, as amended April 30, 1928; 370 O. G. 757)

My invention relates broadly to differential electronic amplifiers.

One of the objects of my invention is to provide means for amplifying variable electric voltage or current, over a broad range of frequencies, in a differential electronic amplifier.

Another object of my invention is to provide means for amplifying variable electric voltage or current, over a broad range of frequencies including zero cycles per second, in a differential electronic amplifier.

Another object of my invention is to provide means for attaining high gain amplification of variable electric voltage or current, over a broad range of frequencies, in a cascaded differential electronic amplifier.

Another object of my invention is to provide means for attaining high gain amplification of variable electric voltage or current, over a broad range of frequencies including zero cycles per second, in a cascaded differential electronic amplifier.

Another object of my invention is to provide means for obtaining amplification of variable electric voltage or current, over a broad range of frequencies, in a push-pull-differential electronic amplifier.

Another object of my invention is to provide means for obtaining amplification of variable electric voltage or current, over a broad range of frequencies including zero cycles per second, in a push-pull-differential electronic amplifier.

Another object of my invention is to provide means for obtaining high gain amplification of variable electric voltage or current, over a broad range of frequencies, in a cascaded push-pull-differential electronic amplifier.

Another object of my invention is to provide means for obtaining high gain amplification of variable electric voltage or current, over a broad range of frequencies including zero cycles per second, in a cascaded-push-pull differential electronic amplifier.

Another object of my invention is to provide means for converting "single-sided" amplification to "push-pull" amplification with controlled exact phase realtions in a differential electronic amplifier.

Another object of my invention is to provide means for exciting a plurality of independent outputs by a single source in a differential electronic amplifier.

Another object of my invention is to provide means for attaining substantially distortionless amplification over a broad band of frequencies in a differential electronic amplifier.

Another object of my invention is to provide means for obtaining substantially distortionless amplification over a broad band of frequencies including high-gain "direct-current" amplification in a differential electronic amplifier, in which the term "direct-current" includes the specialized case of direct resistance coupling.

Another object of my invention is to provide means, in a specialized direct-resistance-coupled application of a differential electronic amplifier, for attaining stable, substantially distortionless amplification at high-gain, at low-noise level, and independent of a critical choice of vacuum tubes.

Other and further objects of my invention will be understood from the specification hereinafter following by reference to the accompanying drawings in which:

Figure 1 shows a means for amplifying variable electric voltage or current in a differential electronic amplifier.

Figure 2 in combination with Figure 1 shows a means for distortionless amplification of variable voltage or current in a differential amplifier.

Within the prior art, and briefly stated, difficulty has been experienced in the design and construction of broad-band electronic amplifiers resulting from the following limitations;

(*a*) In normal electronic amplification non-linearity exists in varying degree in the dynamic load impedance of vacuum tubes.

(*b*) The variable impedance of inductive elements, as frequency is varied, results in distortion and in inability effectively to employ direct impedance coupling or transformer coupling at very low frequencies approaching and including zero cycles per second.

(*c*) The effect of distributed capacitance associated with inductive coupling substantially limits band width.

(*d*) In normal amplification where capacitance and resistance are associated in coupling amplification stages, both distortion and phase shift substantially exist at very low frequencies, and coupling ceases to be effective at zero cycles per second.

(*e*) In so-called direct-current amplifiers critical choice of tubes has been essential to the accomplishment of high-gain in a cascade of stages. This has resulted from the biasing voltages which are developed in the coupling resistance and which tend to block the succeeding stage unless critical tube choice provides accommodation of increasingingly greater "rest-bias" grid voltages.

(*f*) In so-called direct current amplifiers, where change in tube type has been avoided, complex circuit requirements have been introduced either to shift cathode voltage or to provide a battery component of voltage in the grid circuit at high potential with respect to cathode and in opposition to the voltage drop developed in the coupling resistor.

My invention is best described by explanations of typical electronic circuits set forth below. In these descriptions I do not limit my invention to the specific circuits, electronic tubes, voltages, type of power or voltage supply, or applications shown. I do, rather, consider my invention as a broad application of the general principles and circuits described, as capable of operation with various combinations of presently available circuit elements and electronic tubes and as capable of operation incident to such improvement in circuit elements, electronic tubes, and combinations of circuit elements and electronic tubes as the art may later provide.

Figures 1, 2, 3:
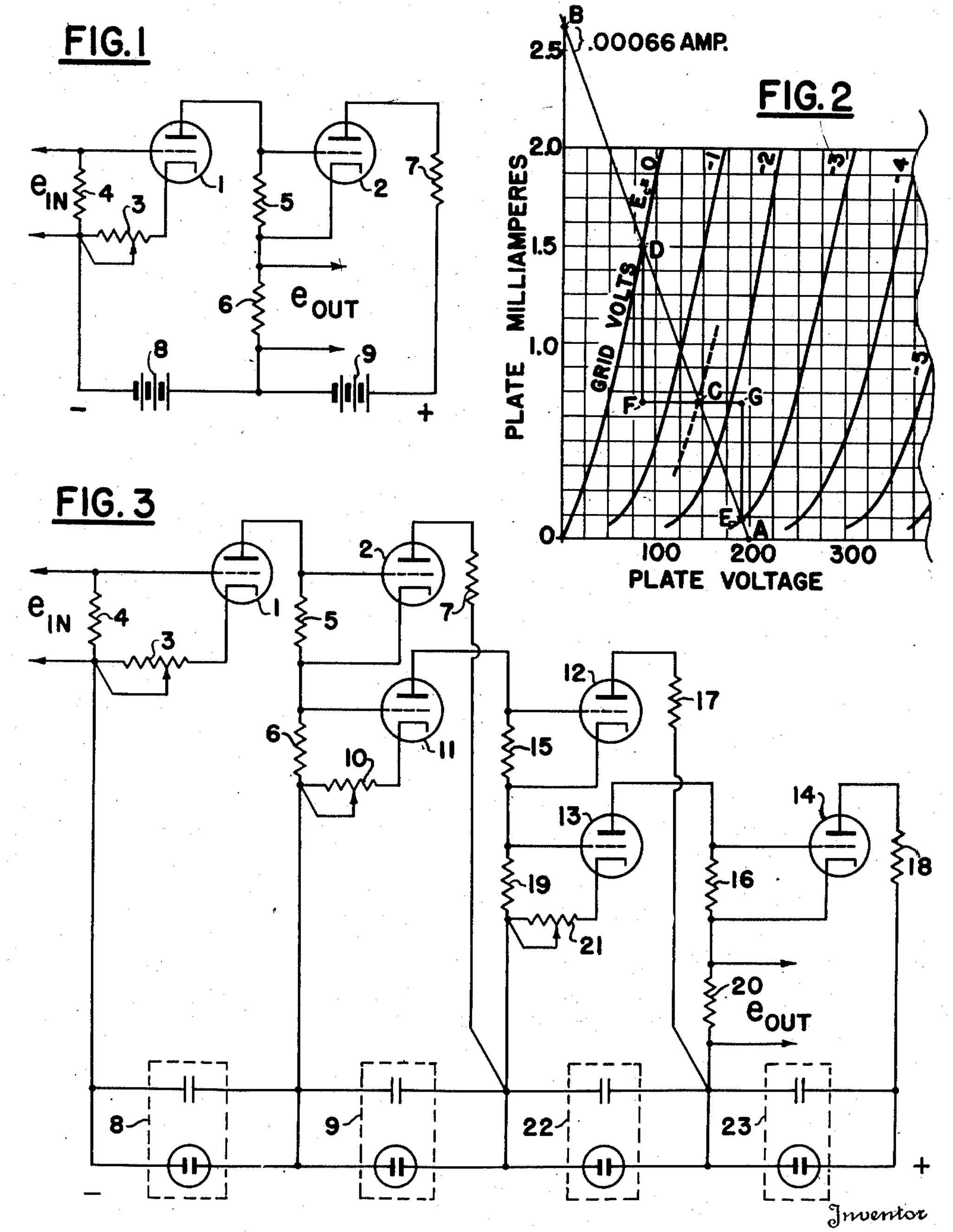
Figure 3 shows a means for cascading stages of amplification in a differential electronic amplifier.

A typical stage of differential electronic amplification is shown in Figure 1, where reference character 1 indicates an input electronic tube including conventional means for providing and controlling electron emission, reference character 2 indicates a differential follower electronic tube similarly including conventional means for providing and controlling electron emission, circuit element 3 indicates suitable control of grid-bias voltage of the input tube, circuit element 4 indicates a suitable means for impressing a variable input voltage or current on the grid-cathode of the input tube, circuit element 5 indicates a suitable means for control of grid-cathode voltage of the differential follower tube, circuit element 6 indicates a suitable means for utilizing the amplified output of a typical elementary stage of differential electronic amplification, circuit element 7 represents suitable means for balancing the dynamic plate load impedances of the input tube and the differential follower tube, and circuit elements 8 and 9 represent a suitable supply of voltage and power. In further explanation of Fig. 1, reference is had to Fig. 2 setting forth in a conventional manner the average plate characteristics of a typical electronic tube, conveniently but not restrictively chosen for observation of the operation of the typical circuit of Fig. 1 and where the load-line AB conveniently represents a dynamic plate load impedance approximately 75,000 ohms and a ratio of plate current change to exciting grid voltage approximating 0.0005 ampere per volt change in grid voltage, where the point C represents a convenient value of grid voltage corresponding to the unexcited condition, and where inequality exists between the dimensions FD and GE indicating a source of distortion in presently employed normal stages of amplification, and is predicated on the point C representing a value of grid voltage midway between the values of grid voltage at points D and E.

With the foregoing in mind, I have observed, and it will be obvious to those versed in the art, that the following sequence of events occurs in the typical circuit of Fig. 1.

(*a*) With suitably chosen values of circuit elements 3 and 5, the plate currents of circuit elements 1 and 2 can be made equal and with consequent zero current in circuit element 6. Let this condition be considered the optimum rest-condition of a typical differential amplification stage.

(*b*) A variable voltage impressed across or variable current caused to flow through circuit element 4 results in a linearly related change of grid-cathode voltage of the input tube and in a substantially linearly related change in plate current of the input tube, circuit element 1.

(*c*) The change in plate current of the input tube results in a change of voltage across circuit element 5 which, viewed as the input grid-cathode voltage of the differential follower tube, circuit element 2, is, under optimum conditions, equal in magnitude and exactly 180 degrees out of phase with the grid-cathode voltage actuating circuit element 1.

(*d*) Incident to the foregoing, a differential change in current results in circuit element 6 linearly related to the signal voltage or signal current impressed on the input tube and in phase with the input voltage impressed on the input tube.

(*e*) The differential current flowing in the differential load element, circuit element 6, constitutes substantial differential amplification of the input signal, and can, under the optimum condition of resistanceless bias of the input tube, be made to approach and approximate numerical equality with the amplification constant of the input tube. The amplified signal is conveniently available for the excitation of succeeding stages, or for useful employment as desired.

(*f*) Any tendency toward instability is opposed and overcome in the typical stage by either or both of the following provisions:

(1) The voltage drop in circuit element 6 consequent on instability opposes and overcomes unstable drift of the grid voltage of the input tube.

(2) The voltage change in resistance self-bias of the grid of the input tube, when cathode self-bias of various forms is employed, inherently opposes unstable drift of grid voltage.

(*g*) Background noise substantially results in conventional single-sided amplifiers from thermal agitation and random uncontrolled transit of electrons in associated electronic tubes. In the typical stage of direct current differential amplification of Fig. 1, substantial portions of this random electron transit occur simultaneously in the two differentially associated electronic tubes and effect cancellation in the differential load element, circuit element 6, with consequent inherently high gain at low-noise level.

(*h*) With combined reference to Fig. 1 and 2, the amplifying action of a conventional electronic tube as biased and excited for "Class A" amplification is considered by the art as linear for small signals. In Fig. 2 and by inspection of the dimensions FD and GE, it is obvious that inequality exists in the magnitudes of change in plate current in the positive and negative sense when large sinusoidal signals are impressed on the grid of an electronic tube suitably biased for Class A amplification. This constitutes distortion in conventional amplification. In the operation of the typical differential electronic amplifier, Fig. 1, similar disproportion in excursions of plate current of the input tube are inherently compensated by consequent changes in grid voltage of the differential follower tube, restoring linearity and resulting in distortionless amplification.

(*i*) Under the optimum condition of employing pure resistance in the circuit elements of Fig. 1, independence from the effects of frequency on the amplitude of amplification exists in the typical differential electronic amplifier stage of Fig. 1.

(*j*) Where a condition of operation is desired or exists, based other than on the optimum unexcited rest-condition of the associated electronic tubes, and where the excursions of input signals remain within the capabilities of the electronic tubes employed, the variation of differential current in the differential load element remains linear with respect to the input signal. This fact is novel and contributes to the successful employment of my invention in precision measurements and to increase in gain by reduction of losses in biasing provisions where power conversion applications are desired in a plurality of cascaded stages.

The general art requires, and has not previously had available, a stable, high-gain, low-noise-level, distortionless differential, electronic amplifier, independent of frequency when desired, not critical as to choice of electronic tubes, not unduly critical as to power supply, not unduly sensitive to the effects of stray electric and magnetic fields, not unduly critical as to adjustment, capable of incorporating compensation for the effects of the capacitance of the electronic tube elements employed and for the effects of the distributed capacitance of associated circuit elements, capable of incorporating frequency-discriminatory filters as desired, capable of conveniently matching the impedance of input and output circuits, and capable of incorporating methods for simultaneously exciting a plurality of output circuits.

Fig. 3 represents a typical method for cascading the amplification of a plurality of typical elementary differential electronic amplifier stages in an high-gain amplifier and where circuit symbols 1, 2, 3, 4, 5, 6, 7 represent circuit elements similar to and performing the same functions as described for the same notations of Fig. 1, circuit elements 11, 12, 13, 14 represent electronic tubes including conventional provisions for emission and control of electrons, circuit elements 10 and 21 represent suitable methods for providing proper rest-bias respectively for the associated tubes 11 and 13, circuit elements 15 and 16 represent suitable methods for providing essential grid control of their respective differential follower tubes 12 and 14, circuit elements 17 and 18 represent suitable methods for accomplishing functions similar to those described for circuit element 7, circuit element 6 indicates a suitable method for simultaneously performing the functions of differential load impedance for the output of the first differential stage and the input impedance of the second differential stage, circuit element 19 similarly indicates a suitable method for simultaneously performing the functions of differential load impedance of the second differential stage and the input impedance of the third differential stage, circuit element 20 indicates a suitable method for combining the functions of differential load impedance of the third differential stage and of connecting the final stage to the desired electronic application, circuit elements 8, 9, 22, 23, represent suitable provision of power supply regulated, filtered and potentially divided as desired.

With reference to Fig. 3, and to the previous descriptions of Fig. 1 and Fig. 2, I have observed, and it will be obvious to those versed in the art;

(*a*) That cascading the amplification of a plurality of typical stages of differential electronic amplification is effectively accomplished by simultaneously combining in a suitable circuit element the functions of differential load impedance of a preceding stage and the functions of input impedance of a following stage.

(*b*) That where the essential circuit impedances are restricted to pure resistance, independence of frequency exists from zero cycles to values of frequency exceeding 20,000 cycles.

(*c*) That at overall voltage gains exceeding 10,000 the values of noise-level as observed on a directly connected cathode ray tube and alternately by the agency of a loud speaker were negligible.

(*d*) That at overall voltage gains exceeding 10,000, and as observed by a calibrated directly connected cathode ray tube, the cascaded stages of amplification when once adjusted, remained in stable adjustment and did not drift with respect to the optimum rest condition for repeated periods of time each exceeding several hours in duration.

(*e*) That at overall voltage gains exceeding 10,000, and as observed by a calibrated directly connected cathode ray tube deliberate departure from the optimum rest condition could be introduced in one stage with compensating adjustment made in a following stage, and, within the capabilities of the vacuum tubes employed, the overall amplification remained linear.

(*f*) That at overall voltage gains of 10,000, and as observed by a directly connected calibrated cathode ray tube and as further observed by a loud speaker, stray magnetic fields could be brought to within approximately one foot of the unshielded amplifier without noticeable reaction.

Various methods have been employed by the art to convert single-sided amplification to push-pull amplification. Where transformers are employed, expensive construction is involved, independence of frequency is difficult to attain and susceptibility to stray magnetic fields is present. Where combinations of capacitance and resistance are utilized to produce the conversion, uncontrolled phase shift occurs as a function of frequency.

Figure 4:
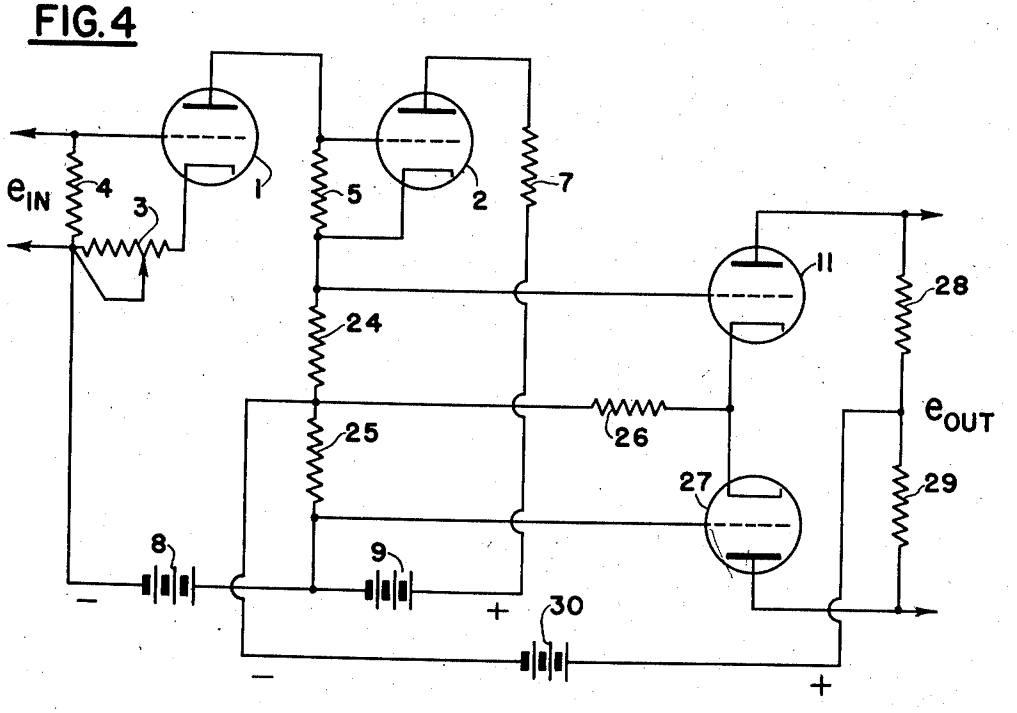
Figure 4 shows a means for converting single-sided amplification to push-pull amplification with exact phase relations in a differential electronic amplifier.
Figure 5:
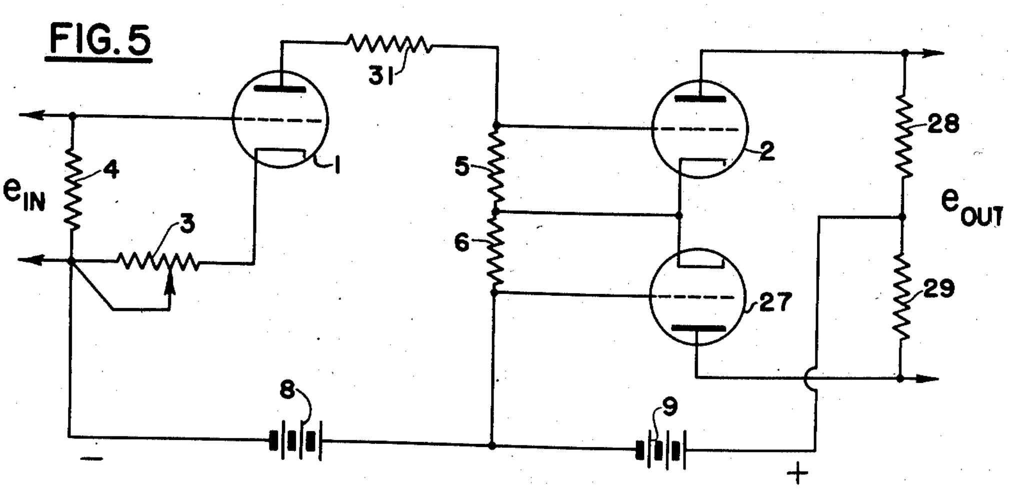
Figure 5 shows an alternate means for converting single-sided amplification to push-pull amplification with exact phase relations in a differential electronic amplifier.

Figures 4 and 5 represent typical differential electronic amplifiers, converting single-sided amplification to push-pull amplification, where circuit elements, 1, 2, 3, 4, 5, 6, 7, 8, 9 perform functions similar to those described for the same symbols of Figure 1, circuit elements 11 and 27 represent conventional electronic tubes, together with means for providing and controlling electronic emission, circuit elements 24 and 25 represent two suitable and equal impedances replacing circuit element 6 of Figure 1, circuit element 26 represents a suitable means for biasing circuit elements 11 and 27, circuit elements 28 and 29 represent suitable output impedances for utilizing the push-pull output of vacuum tubes 11 and 27, circuit element 30 represents a suitable power supply, together with such filtering, potential division, and voltage regulation as may be desired, and circuit element 31 represents a suitable means for establishing a desired dynamic plate load impedance in the plate circuit of vacuum tube circuit symbol 1.

With reference to Fig. 4, and to the previous description of Fig. 1, I have observed, and it will be obvious to those versed in the art, that the differential current flowing in the two equal impedances 24 and 25 establishes and impresses on vacuum tubes 11 and 27 correct input voltages with exact phase relations as required for push-pull operation.

With reference to Fig. 5, and to the previous description of Fig. 1, I have observed, and it will be obvious to those versed in the art:

(*a*) That by suitable choice of circuit elements 5, 6 and 31 and in the unexcited condition, the plate currents of vacuum tubes 1, 2 and 27 can be made equal, that the differential relations between the input tube 1 and its differential follower tube 2 are preserved, that vacuum tube 27 will then be self-biased by its own cathode current through circuit element 6 and in an amount equal to the bias impressed on vacuum tube 2.

(*b*) That, when the input tube 1 is excited, current division occurs at the junction of circuit elements 5 and 6 as controlled by the plate current of vacuum tube 1 and in such manner as to provide excitation of vacuum tubes 2 and 27 with exact phase relations and voltage values as required for push-pull operation.

Filtering and voltage regulation of the power supply may be made less vigorous by the employment of push-pull differential amplification since in this type of amplification current changes in the power supply leads may substantially be minimized.

Figure 6:
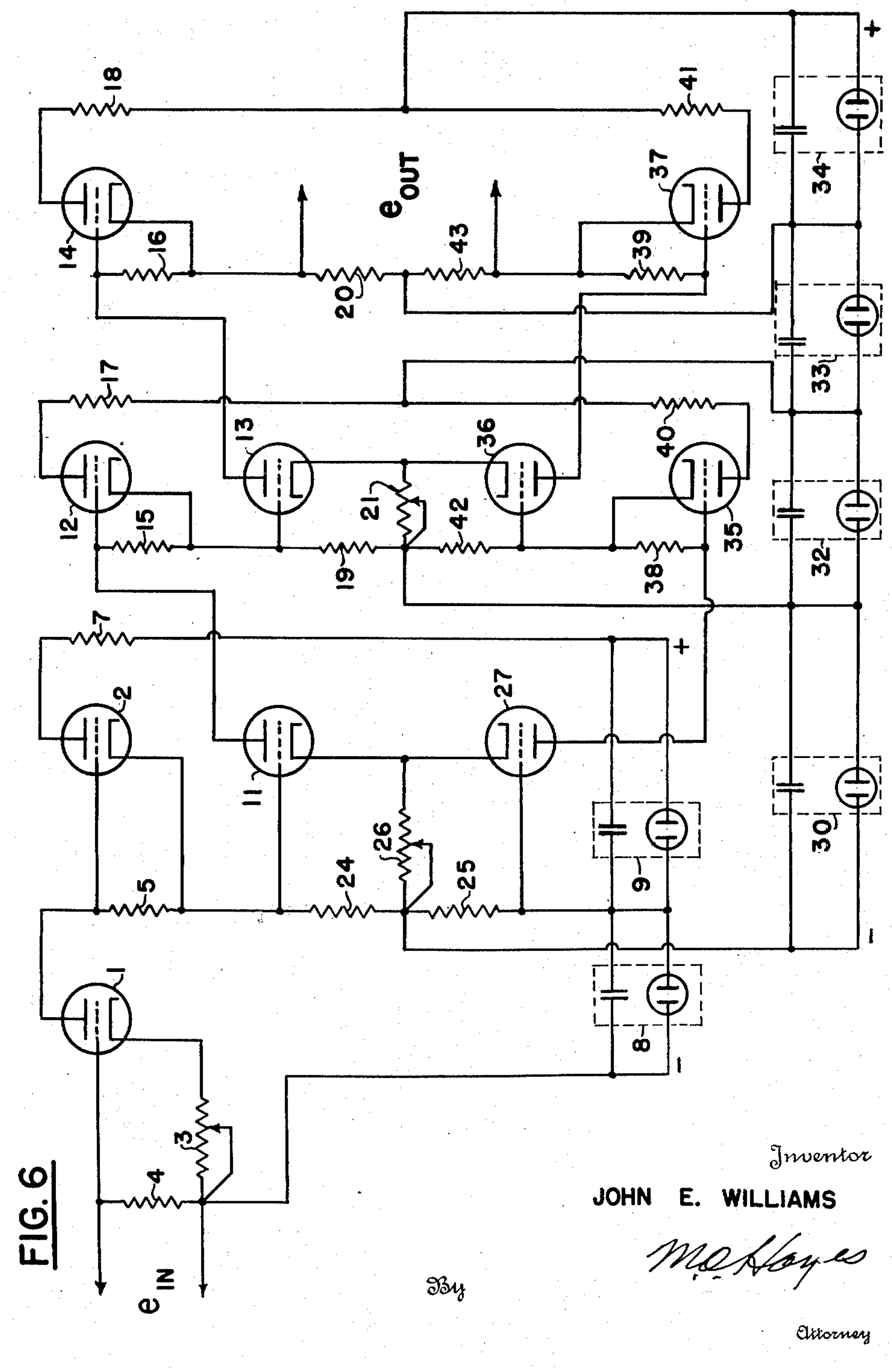
Figure 6 shows a means for cascading push-pull differential amplification.

Fig. 6 shows a typical push-pull differential cascaded amplifier in which circuit elements 1, 2, 3, 4, 5, 7, 8 and 9 represent elements performing the same functions previously described or the same symbols of Fig. 1, circuit elements 11, 12, 13, 14, 15, 16 17, 18, 19, 20 and 21 perform the same functions as those previously described for the same symbols in Fig. 3, circuit elements 24, 25, 26, 27, 30 perform the same functions as those previously described for the same symbols in Fig. 4, circuit elements 32, 33, 34 represent suitable provision of power supply including filtering, potential division, and voltage regulation as desired, circuit elements 35, 36, 37 represent conventional electronic tubes including means for providing and controlling electron emission, circuit elements 38, 39 represent suitable means for providing control of grid voltage of the associated tubes 35 and 37, circuit elements 40, 41 represent suitable means for balancing the dynamic plate load impedance of the associated tubes 35 and 37, circuit element 42 represents suitable means for providing a differential load impedance for tubes 27 and 35 and mutual to the input of tube 36, circuit element 43 represents suitable means for providing a differential load impedance for tubes 36 and 37 and for utilizing the output of tubes 36 and 37 as desired.

With reference to Fig. 6, and with further reference to previous descriptions of Fig. 1, Fig. 3 and Fig. 4, I have observed, and it will be obvious to those versed in the art that conversion from single-sided amplification to push-pull amplification and subsequent cascaded high-gain amplification is effectively accomplished in a push-pull differential electronic amplifier.

Figures 7, 8:
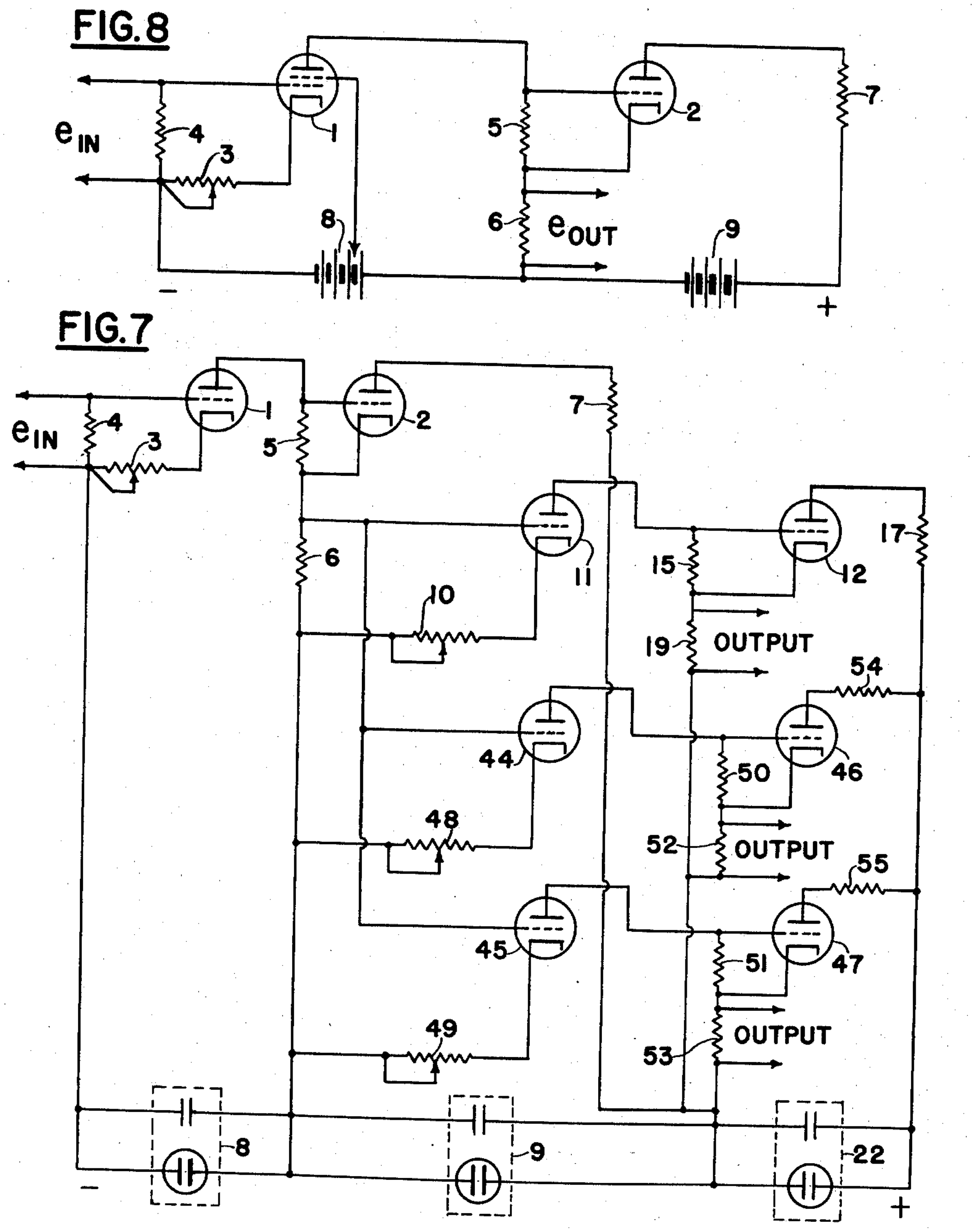
Figure 7 shows a means for simultaneously and independently exciting a plurality of output circuits by a single source in a direct circuit differential electronic amplifier.
Figure 8 shows a means for associating multigrid electronic tubes in differential combination with triode followers in a differential electronic amplifier.

Fig. 7 represents a typical direct current differential electronic amplifier converting a single exciting input to a plurality of linearly related outputs, where circuit elements 1, 2, 3, 4, 5, 6, 7, 8, 9 perform functions similar to those described for the same symbols of Fig. 1, and where circuit elements 11, 44, 45 represent suitable electronic input tubes together with conventional means for producing and controlling electron emission, circuit elements 12, 46, 47 represent suitable electronic differential follower tubes together with conventional means for producing and controlling electron emission, circuit elements 10, 48, 49 represent suitable means for biasing the related electronic input tubes, circuit elements 15, 50, 51 represent suitable means for converting the variable plate currents of their associated preceding electronic input tubes to suitable values of grid control voltage of the also associated differential follower tubes, circuit elements 19, 52, 53 represent suitable differential load impedances of their respective related differential circuits, circuit elements 17, 54, 55 represent suitable means for balancing the plate load impedances of their related input tubes and differential follower tubes, circuit elements 8, 9, 22 represent suitable means for filtering, potential division, and regulation of the power supply.

With preceding descriptions in mind and with reference to the typical differential electronic amplifier of Fig. 7, I have observed, and it will be obvious to those versed in the art:

(*a*) That a variable input voltage or current impressed on circuit element 4 produces a linearly related differential current in and voltage across circuit element 6, and further (*b*) That the then existing differential voltage of circuit element 6 is mutual to and simultaneously excites the input tubes of the plurality of circuits shown and produces differential currents in their related differential load impedances respectively circuit elements 19, 52, 53, and further (*c*) That the differential currents of the plurality of output circuits shown are linearly related to and in phase with the input signal voltage impressed on circuit element 4, and further.

(*d*) That the differential currents in the plurality of output circuits shown are suitably and simultaneously available for useful employment as may be desired.

Under certain operating conditions it may be desirable to incorporate the operating features of multi-grid electronic tubes in a direct current differential amplifier. Two such conditions are cited as examples, but not restrictively:

(*a*) The power sensitivity of a beam power tube or pentode.

(*b*) The employment of a screen grid to reduce capacity coupling through the elements of an electronic tube and between a preceding and consequent circuit, particularly at radio frequencies.

Another typical stage of differential amplification is shown in Fig. 8, where a multi-grid electronic tube is associated with a triode, and where circuit elements 1, 2, 3, 4, 5, 6, 7, 8, 9 perform functions similar to those described above for the same symbols of Fig. 1.

With reference to Fig. 8, I have observed, and it will be obvious to those versed in the art:

(a) That by reference to previous descriptions and suitable choice of circuit elements, the plate curents of circuit elements 1 and 2 can be made equal in the optimum unexcited rest condition, and further (b) That excursions in the plate current of circuit element 1, as caused by suitable excitation of that element, result in changes of plate current in circuit element 2 equal in magnitude and opposite in phase to the changes in plate current of circuit element 1, and further (c) That the resulting differential current in the differential load element 6, is linear with respect to and in phase with signal voltage exciting circuit element 1.

Figure 9:
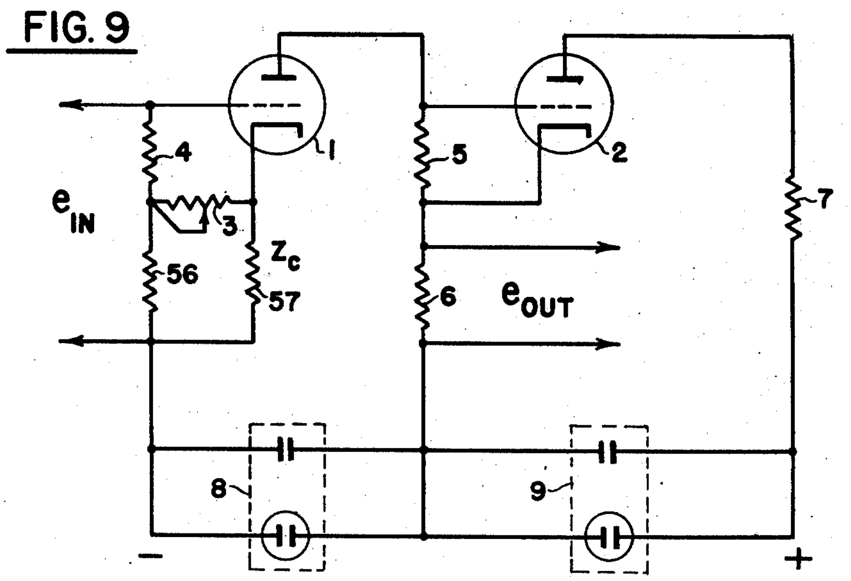
Figure 9 shows a means for combining compensation for the effects of distributed capacitance in a differential electronic amplifier.

Fig. 9 shows a typical stage of direct current differential electronic amplification incorporating compensation where circuit elements 1, 2, 3, 4, 5, 6, 7, 8, 9 perform functions similar to and bear the same rotation as those previously described for Fig. 1, and where circuit element 56 preferably, but not restrictively, resistive represents an impedance forming part of the plate impedance of tube 1 but introduced on the cathode side, and circuit element 57 represents a suitable element incorporating controlled frequency discrimination.

With reference to Fig. 9 and as based on previous descriptions herein, I have observed, and it will be obvious to those versed in the art:

(a) That an input variable voltage impressed across circuit elements 4 and 56 as shown results in a portion of that voltage being impressed on and actuating the input tube, circuit element 1, and further (b) That with the impedance of circuit element 57 adjusted to infinity a controlled constant value of degeneration exists in the circuit associated with the input tube and results in a decreased but constant value of amplified voltage across circuit element 6, and further (c) That with the impedance of circuit element 57 adjusted to a suitable finite value and dependent on frequency, a variable but definite control of degeneration is available together with corresponding control of amplification and provides a means for compensating the differential amplifier for the effects of the capacitance associated with the elements of the electronic tubes employed and for the effects of the distributed capacitance of other associated circuit elements and their connections.

Figure 10:
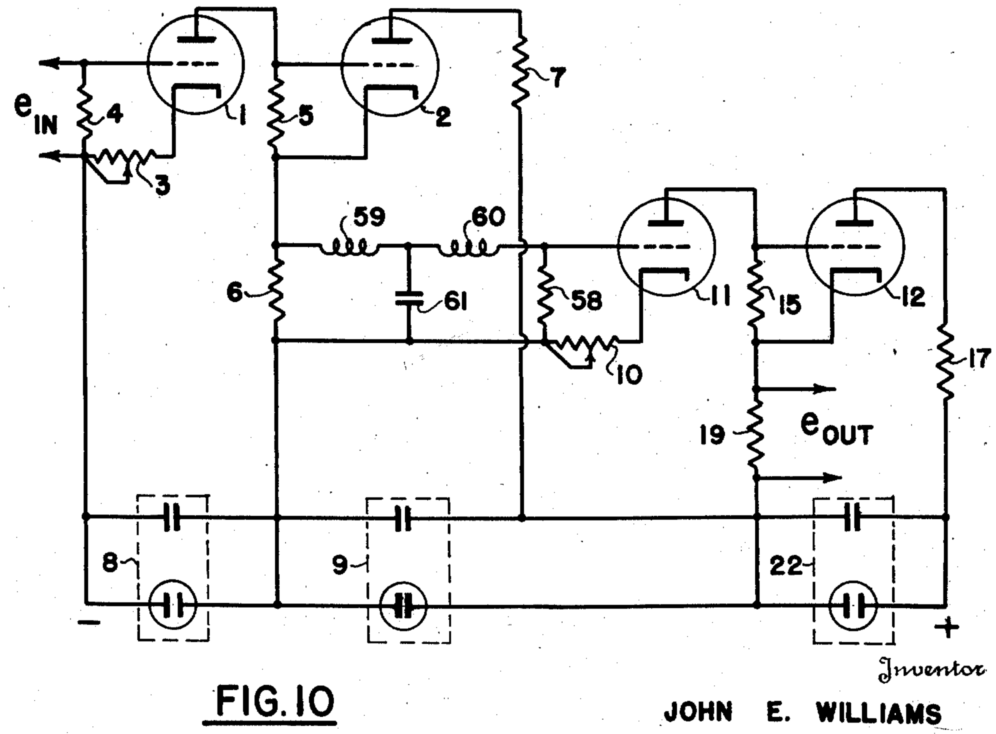
Figure 10 shows a means for combining a low-pass filter with a direct current differential electronic amplifier.

Fig. 10 shows a typical differential electronic amplifier incorporating a typical low-pass filter in which circuit elements 1, 2, 3, 4, 5, 6, 7, 8, 9 perform functions similar to the circuit elements bearing the same symbols in Fig. 1 and previously described, and in which circuit elements 10, 11, 12, 15, 17, 19, 22 perform functions similar to the circuit elements bearing the same symbols in Fig. 3 and previously described, and in which circuit elements 6 and 58 additionally represent suitable means for connecting the differential load output of the preceding stage to a typical low pass filter and in turn suitably connecting the output of that filter to the input of the succeeding stage, circuit elements 59, 60, 61 represent suitable values of inductance capacitance and resistance composing a typical low pass filter.

With reference to Fig. 10, I have observed, and it will be obvious to those versed in the art, that resistive elements 6 and 58, as shown, provide optimum relations for incorporation of a low-pass filter in a differential electronic amplifier.

Figure 11:
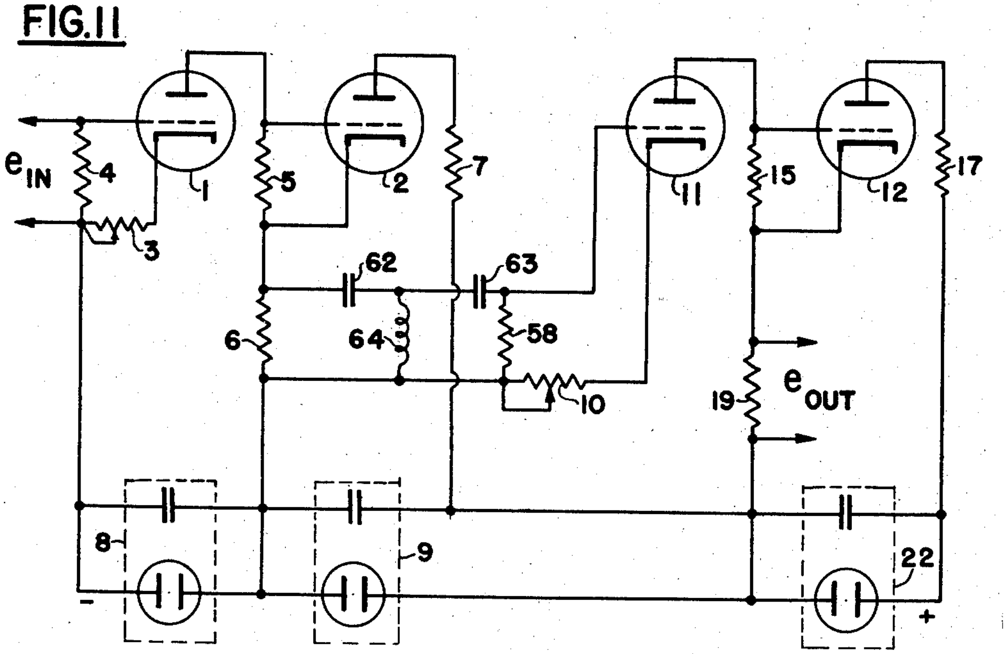
Figure 11 shows a means for combining a high-pass filter with a direct current differential electronic amplifier.

Fig. 11 shows a typical differential electronic amplifier incorporating an high-pass filter in which circuit elements 1, 2, 3, 4, 5, 6, 7, 8, 9, 10, 11, 12, 15, 17, 19, 22, 58 perform functions similar to the circuit elements bearing the same symbols in Fig. 10 and previously described, and in which symbols 62, 63, 64 represent suitable values of capacitance inductance and resistance of a typical high-pass filter.

With reference to Fig. 11, I have observed, and it will be obvious to those versed in the art, that resistive elements 6 and 58, as shown, provide optimum relations for incorporation of a typical high-pass filter in a direct current differential electronic amplifier.

Figure 12:
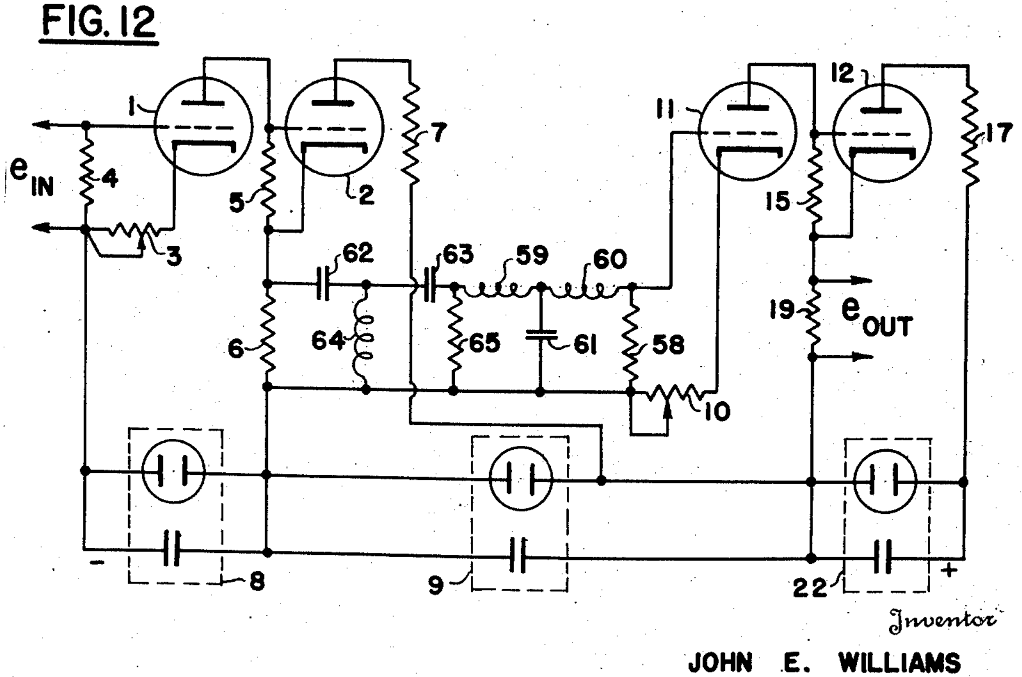
Figure 12 shows a means for combining a band-pass filter with direct current differential electronic amplifier.

Fig. 12 shows a typical differential electronic amplifier incorporating a typical band pass filter in which circuit elements 1, 2, 3, 4, 5, 6, 7, 8, 9, 10, 11, 12, 15, 17, 19, 22, 58, 59, 60, 61, 62, 63, 64 perform functions similar to those bearing the same notation in Fig. 11 and previously described, and in which circuit element 65 represents a suitable means of providing circuit continuity and matching of sections of the band pass filter.

With reference to Fig. 12, I have observed, and it will be obvious to those versed in the art, that resistive elements 6 and 58, as shown, provide optimum relations for incorporation of a typical band-pass filter in a direct current differential electronic amplifier.

The invention described herein may be manufactured and used by or for the Government of the United States of America for governmental purposes without the payment of any royalties thereon or therefor.

What I claim is:

1. An electronic amplifier comprising a power supply and a plurality of vacuum tubes each having at least a cathode, grid and anode, an input circuit for one of said vacuum tubes, a second tube having the grid thereof operatively connected to the anode of said one of the tubes, an impedance element connected to the anode and in the output circuit of said second vacuum tube, a circuit including an impedance element common to the output of said first vacuum tube and to the input of said second vacuum tube being connected between the grid and cathode thereof and an impedance element common to the outputs of both first and second vacuum tubes and to the input of a third vacuum tube, a fourth tube having the grid thereof operatively connected to the anode of the third tube, an impedance element connected to the anode and in the output circuit of said fourth vacuum tube, and a circuit including an impedance element common to the output of said third vacuum tube and to the input of said fourth vacuum tube being connected between the grid and cathode thereof and an output impedance element common to the outputs of both third and fourth vacuum tubes, whereby cascaded differential amplification of direct-current and a wide range of frequencies is provided.

2. An electronic amplifier comprising a plurality of vacuum tubes each having at least a cathode, grid and anode, an input circuit for the first of said vacuum tubes, a second tube having the grid thereof operatively connected to the anode of said first tube, an impedance element in the output of said second vacuum tube, a circuit including an impedance element common to the output of said first vacuum tube and to the input of the second vacuum tube and an impedance element common to the outputs of said first and second vacuum tubes and to the inputs of third and fourth vacuum tubes, circuit elements in the output of fifth and sixth vacuum tubes, and a circuit containing elements common to the outputs of said third and fourth vacuum tubes and to the inputs of said fifth and sixth vacuum tubes and elements common to the outputs of said third, fourth, fifth and sixth vacuum tubes, whereby differential push-pull amplification is provided.

3. An electronic amplifier comprising at least three vacuum tubes each having at least the elements of a triode, an input circuit connected to the grid of the first of said vacuum tubes, a circuit impedance element in the anode circuit output of the first vacuum tube, a circuit impedance element common to said anode circuit of said first vacuum tube and to the input of a second vacuum tube and containing an impedance element common to said anode circuit and to the cathode circuits of said second and of a third vacuum tube, last said impedance element comprising the input of said third vacuum tube, and a system output containing a pair of series-connected impedance elements in the anode circuits of said second and third vacuum tubes, the anode supply for last said tubes being completely separate from the anode supply for the first tube and being connected through a common point between said pair of series-connected impedance elements whereby differential push-pull amplification is provided.

4. An electronic amplifier comprising a plurality of vacuum tubes, an input and an output circuit for at least one of said vacuum tubes, another vacuum tube, and a circuit for said other tube including an element common to said output circuit of said one vacuum tube and to the input of said other vacuum tube, and a circuit for conversion of the amplifier output to push pull including a pair of equal impedances series connected in the plate supply of said one tube and two tubes of said plurality at least one thereof being a further tube, the said two tubes being energized through equal impedances from a common source and having cathodes thereof jointly connected to the junction of said pair of impedances, the grids of said two tubes being connected, respectively, to opposite ends of said pair of impedances, and at least the higher potential member of said pair of impedances being in the cathode circuit of said other vacuum tube.

5. In a linear direct current amplifier having push-pull output and comprising a plurality of vacuum tubes each having a least the elements of a triode, an input impedance connected between the grid and cathode of one of said tubes, a second impedance in the plate circuit of said one tube, a second said tube having the grid and cathode thereof connected across said second impedance, a third impedance connected in series with said second impedance and in the plate circuit of said one tube, a circuit including a third said tube and another said tube electrically joined together at the cathodes thereof, the junction being connected to the lower potential end of said third impedance, said other tube of said circuit having the grid thereof connected to said plate circuit between said second and third impedances, the impedance between said junction and the grids of the two tubes, respectively, of said circuit being equal, said circuit including a further impedance element between the plates of said third tube and said other tube, and means energizing said circuit of the amplifier through the midpoint of said further impedance.

6. An electronic amplifier comprising a plurality of tubes each having at least a cathode, grid and plate, a first tube thereof having an input impedance connected between the cathode and grid thereof, a first voltage supply operatively connected from the cathode of said first tube to the plate thereof through at least three impedance elements, one said element being connected to the plate of first said tube and a second and third of said elements of equal value connected in series between said first element and said voltage supply, second and third tubes thereof having a common cathode connection to the junction of said second and third said elements and the grid of said second tube connected to the junction of said first and second elements with the grid of said third tube connected to said third element at the voltage supply end thereof, whereby voltage across the input impedance of the first tube is applied after amplification therein inversely to said second tube across said second element and directly to said third tube across said third element, a pair of equal ouput impedances series connected between the plates of said second and third tubes, and a second voltage supply operatively connected at said voltage supply end of the said third element and to the common junction of said pair of output impedances, whereby the cathode currents of said second and third tubes pass through said third element in opposite sense to the current supply for said first tube from said first voltage supply to convert single-sided input excitation to push-pull output across said pair of impedances.

7. In an electronic amplifier comprising a plurality of tubes each having at least a cathode, grid and plate, a first tube thereof biased for Class-A amplification and having an input impedance between the grid and cathode thereof, a first voltage supply for said first tube operatively connected from the cathode to the plate thereof through at least three impedance elements in series, two of said elements being adjacent and of equal impedance, second and third said tubes having the grids thereof connected at the opposite extremities of said two elements and the cathodes thereof connected in common to the junction of said two elements, whereby equal biases on said second and third tubes result from equal currents in the three said tubes, an output impedance operatively connected between the plates of said second and third tubes for presenting a push-pull output therefrom, and a second voltage supply parallel-connected through an impedance element to the cathodes of said second and third tubes and to the electrical midpoint of said output impedance, whereby said output is the difference in voltage drop in the halves of the output impedance about said midpoint resulting from the difference in current in said second and third tubes.

8. In the amplifier of claim 7, a fourth said tube having the grid thereof connected electrically at the potential of the plate of first said tube and the cathode at the grid potential of the second said tube, a third voltage source connected to the grid of said third tube and to the plate of said fourth tube through a load impedance, whereby the effect of plate current in the first said tube upon said differential output is increased by increasing the component of common current of the same sign in said two equal impedances.

9. In an electronic amplifier for high gain linear amplification of an input voltage thereto comprising a plurality of tubes having at least a grid, cathode and plate, a first tube having in the high voltage connection to the plate thereof a plurality of series connected impedance elements, a pair thereof being of equal magnitude, a second and third of said tubes being arranged in push-pull and supplied from a separate voltage source to the plates thereof, a second pair of equal impedances arranged for push-pull differential output and connected in series between the plates of said second and third tubes, said separate voltage source being connected to the common junction of the second pair of impedances, a cathode resistance connected to a common junction at the cathode potential of the second and third tubes and to the negative portion of said separate source, the grids of last said tubes being connected to opposite ends respectively of the first said pair of equal impedances, and means connecting said common junction of the second and third said tubes to the common junction of first said pair of equal impedances for biasing the second and third tubes equally and oppositely in proportion to plate current in said first tube.

10. An electronic amplifier according to claim 9, said cathode resistance connected to said junction at cathode potential of the second and third tubes being connected at the opposite end thereof to said common junction of the first said pair of equal impedances, whereby equal and opposite bias changes are produced on the grids of the second and third tubes as current in the first tube changes.

11. In an amplifier according to claim 10, said plurality of impedances including a third impedance, a fourth tube having the grid and cathode thereof connected across said third impedance and the plate thereof supplied from a positive voltage source having a negative connection thereof to the grid of said third tube, and an impedance element between said positive source and the plate of the fourth tube of selected magnitude to equalize the currents in the first and fourth tubes for conditions of no input to the first tube to provide a zero amplification.

12. An electronic amplifier according to claim 9, said cathode resistance connected to said junction at cathode potential of the second and third tubes being the member of first said pair of equal impedances nearer to the first said source of voltage supply, whereby with constant combined current in the second and third tubes changes in bias thereon resulting from changes in conduction in the first tube are equal and of opposite sign.

13. A balanced amplifier converting single-sided input to push-pull output including a pair of similar power sources series connected with midpoint and end terminals, a circuit between said end terminals including the cathode-anode circuits of a pair of electron discharge devices, said circuit including a resistor between one of said end terminals and the anode of one of said devices and a resistor between the cathode of the other of said devices and the other of said end terminals and a third resistor between the remaining anode and cathode of said devices respectively, one of said discharge devices having its input connected across the anode circuit resistor of said other device and its cathode connected through an impedance to said intermediate terminal, the second of said resistors forming a self-biasing means for the device to which it is connected, signal input means connected to said other device, and a third similar discharge device excited from the voltage across said impedance in inverse phase from first said device, the cathode of said third device being connected through at least a portion of said impedance to said midpoint.

14. In an amplifier of claim 13 wherein said impedance has two end terminals and a midpoint, a fourth discharge device having the cathode thereof connected to the cathode of said third device and to the midpoint of said impedance, the third and fourth devices being controlled in push-pull from said two end terminals of the impedance, and a pair of impedances series connected between the anodes of the third and fourth devices, plate supply therefor being at the junction of the pair of impedances, the amplifier output being thereacross.

JOHN E. WILLIAMS.

REFERENCES CITED

The following references are of record in the file of this patent:

UNITED STATES PATENTS

| Number | Name | Date |
|---|---|---|
| 2,120,823 | White | June 14, 1938 |
| 2,123,924 | Artzt | July 19, 1938 |
| 2,164,402 | Guanella | July 4, 1939 |
| 2,289,947 | Wills | July 14, 1942 |
| 2,310,342 | Artzt | Feb. 9, 1943 |
| 2,324,797 | Norton | July 20, 1943 |
| 2,350,858 | Worcester, Jr. | June 6, 1944 |
| 2,383,351 | Smith | Aug. 21, 1945 |
| 2,401,447 | Wijeff | June 4, 1946 |
| 2,410,081 | Kenyon | Oct. 29, 1946 |
| 2,412,227 | Och et al. | Dec. 10, 1946 |